United States Patent [19]

Numano et al.

[11] Patent Number: 5,739,575
[45] Date of Patent: Apr. 14, 1998

[54] DIELECTRICALLY ISOLATED SUBSTRATE AND METHOD FOR MANUFACTURING THE SAME

[75] Inventors: Masanori Numano, Kanagawa-ken; Norihiko Tsuchiya, Tokyo; Hiroyasu Kubota, Chiba-ken; Yoshiaki Matsushita, Kanagawa-ken; Yoshiki Hayashi, Kanagawa-ken; Yukihiro Ushiku, Kanagawa-ken; Atsushi Yagishita, Kanagawa-ken; Satoshi Inaba, Tokyo; Yasunori Okayama; Minoru Takahashi, both of Kanagawa-ken, all of Japan

[73] Assignee: Kabushiki Kaisha Toshiba, Kawasaki, Japan

[21] Appl. No.: 705,647

[22] Filed: Aug. 30, 1996

[30] Foreign Application Priority Data

Aug. 31, 1995 [JP] Japan .................... 7-223963

[51] Int. Cl.⁶ .................................... H01L 29/00
[52] U.S. Cl. .................. 257/513; 257/510; 257/519; 257/647
[58] Field of Search ................ 257/622, 510, 257/513, 519, 647–648; 438/424, 444, 447, 450

[56] References Cited

U.S. PATENT DOCUMENTS

| | | |
|---|---|---|
| 4,506,435 | 3/1985 | Pliskin et al. .......................... 257/519 |
| 5,250,837 | 10/1993 | Sparks .................................... 257/519 |
| 5,574,299 | 11/1996 | Kim ........................................ 257/519 |

*Primary Examiner*—Mahshid D. Saadat
*Assistant Examiner*—John Guay
*Attorney, Agent, or Firm*—Oblon, Spivak, McClelland, Maier & Neustadt, P.C.

[57] ABSTRACT

Element isolation technique for LSIs having a fine pattern of sub-micron class or finer. A high strained region doped with impurities at a high concentration is formed under, and remote from, a buried insulating material (dielectrics) layer for element isolation. With this buried dielectrics element isolation (BDEI) structure, since the high strained layer exists just under the buried dielectrics layer, crystal defects generated near the buried dielectrics layer due to strain caused by a difference of thermal expansion coefficient between a semiconductor layer and the buried dielectrics layer, are moved toward the high strained layer. Accordingly, the crystal defects do not reach an active region where active elements are formed, so that leakage current in the p-n junction formed in the active layer can be advantageously reduced.

13 Claims, 7 Drawing Sheets

DIELECTRICALLY ISOLATED SUBSTRATE AND METHOD FOR MANUFACTURING THE SAME

BACKGROUND OF THE INVENTION

1. Field of the Invention

The present invention relates to element isolation technology used for semiconductor devices such as LSIs, and more particularly to an element isolation substrate and a manufacture method therefor. The element isolation technology is used for semiconductor integrated circuits of a fine structure of sub-micron class or higher integration density.

2. Description of the Related Art

Of various types of ULSIs and VLSIs, MOS type semiconductor elements are relatively easy to be finely fabricated, and MOSLSIs are used for 256 Mb DRAMs or the like and are still becoming finer. In order to form an LSI having MOS type semiconductor elements including active elements such as transistors and passive elements such as capacitors and resistors, element forming regions or active regions are required to be electrically separated. Namely, an element isolation region is required to electrically separate one active region (element forming region) from another which are constituents of an LSI. One of most important technical issues during the development of MOSLSI techniques have always been a technology of forming an element isolation region, i.e., an element isolation technology. One epoch making evolution in the history of element isolation technology was the development of LOCOS (LOCal Oxidation of Silicon) technique which can define an element forming region and an element isolation region in a self-alignment fashion. As shown in FIG. 1, with the LOCOS method, a substrate is selectively oxidized by using a nitride film ($Si_3N_4$) mask 18 excellent in anti-oxidation characteristics, and an oxide film ($SiO_2$) 12 is formed only on the desired silicon surface where the $Si_3N_4$ film is not formed. Then this oxide film is used as a field oxide layer or an insulating layer for element isolation. It is not too much to say that today's prosperity of MOSLSI industries was due to a combination of this isolation technique and polysilicon gate techniques. In the age of sub-micron or deep sub-micron fine fabrication, this LOCOS technique now comes near to its limit. The most conspicuous problem of this technique is a presence of a so-called "bird's beak". Namely, the problems in the LOCOS technique are the lower area efficiency due to invasion into an element forming region (active region), and the crystal defects or the local strain generated when the field oxide film is formed. The bird's beak is one factor hindering high integration of semiconductor devices, particularly high integration VLSIs or ULSIs, and the oxide film 12 is required to be thinned for fine fabrication. However, as the insulating oxide film is thinned, the breakdown voltage between elements is lowered, posing another new problem. In order to solve these problems, improved LOCOS methods or a variety of new isolation techniques have been proposed. For example, heretofore proposed, the improved element isolation techniques derived from the LOCOS method include the gate oxidation method (GOM), the reverse etching of oxide method (REOX), the selective poly-Si oxidation method (SEPOX), the recessed oxide method (ROX), the Improved Coplanar method, the Direct thermal silicon nitride film mask method, and the Side Wall Masked Isolation (SWAMI) method. Also the Selective Epitaxial Growth method and the U-groove (U-groove Isolation) method are proposed.

In addition to the above element isolation techniques, an oxide film burying method called the Buried OXide (BOX) method illustrated in FIG. 2 has drawn attention as an element isolation technique for sub-micron or deep sub-micron scale ULSIs or the like. The BOX method illustrated in FIG. 2 is also called a buried insulator element isolation method. Although this buried insulator element isolation method or BOX method can fabricate fine devices, it is associated with a new problem of crystal defects such as dislocations caused by strain generated in a semiconductor (silicon) substrate 21 in which active elements, capacitors, and the like are formed. This strain is generated during the formation of element isolation regions or, after this formation, during heat treatment processes of ULSI manufacture, because these semiconductor substrate 21 and the insulating member 22 (e.g., Silicon oxide: $SiO_2$) buried in a trench have different thermal expansion coefficients.

Crystal defects are likely to be generated particularly during practical ULSI manufacturing processes. Namely, in addition to strain caused by the element isolation structure by itself, the damages are caused by ion implantation process, and other strains are also caused in the interface between the semiconductor and metal electrodes, interlayer insulating films, or other films. The conventional BOX method is, therefore, associated with these problems and the metal impurities or the like are easily captured by the crystal defects, and crystal defects in the active region (element forming region) may cause electrical faults such as the generation of a junction leakage and the lowering of a dielectric breakdown voltage of a gate oxide film. One important issue of development of fine ULSIs and VLSIs is therefore to provide an element isolation method which does not generate crystal defects. The problems to be solved for the fabrication of fine ULSIs, VLSIs, and the like are, for example:

(a) no bird's beak;
(b) flat surface; and
(c) no crystal defect.

The buried element isolation method such as the BOX method is free of the bird's beak problem. However, the problems (b) and (c) are critical problems to be solved.

SUMMARY OF THE INVENTION

In view of the above problems, an object of the present invention is to provide an element isolation structure and its manufacturing method capable of reducing crystal defects in an element forming region, facilitating high integration density, and applying to semiconductor devices such as ULSIs.

In order to achieve the above object, a first aspect of the invention provides, as illustratively shown in FIG. 3 or FIGS. 6A to 6C, in FIGS. 7A to 7D, and in FIGS. 8A to 8F, a semiconductor substrate 41 having element isolation regions made of a plurality of grooves 47 formed in the surface layer of the substrate and dielectrics (insulating members) 42 buried in the grooves 47, and element forming regions or active regions 43, 53, and 68 formed between adjacent grooves 47, wherein high strained layers 44, 54 of high impurity concentration regions are formed under, and remote from, the bottoms of the grooves. A distance between the bottom of the groove and high strained layer is preferably 50% or less of the depth of the groove. "The plurality of grooves" indicates a plurality of apparent grooves viewed along a certain cross section of the substrate. Therefore, it is obvious that the term "plurality of grooves" includes a continuous single groove as viewed on a plan pattern although it is drawn as a plurality of grooves in a certain cross section. For example, in FIG. 6A, the groove 47 as viewed on a plan view surrounds the four sides of a central rectangular protrusion on a semiconductor substrate 41.

A second aspect of the invention provides, as shown by the cross sectional views of FIGS. 6A to 6C, a method of manufacturing a buried dielectrics element isolation (hereinafter called "BDEI") substrate comprising at least: a first step of forming a plurality of grooves 47 in a surface layer of the semiconductor substrate, a second step of forming a high strained layer of a high impurity concentration region 44 remote from the bottom of each groove, by, for example, selective ion implantation to the bottom of each groove 47, and a third step of burying a dielectrics (an insulating member) in the inside of each groove.

A third aspect of the invention provides, as shown by the cross sectional views of FIGS. 7A to 7D, a method of manufacturing a BDEI substrate comprising at least: a first step of forming a plurality of high strained layers of high impurity concentration regions 54 in a surface layer of a semiconductor substrate 41 at predetermined areas, a second step of forming an epitaxial growth layer 58 on the substrate and on the high impurity concentration regions, a third step of forming a groove 47 in the epitaxial growth layer 58 over each high impurity concentration region 54, the groove being formed at a depth shallower than the high impurity concentration region, and a fourth step of burying a dielectrics 42 in the inside of each groove.

A fourth aspect of the invention provides, as shown by the cross sectional views of FIGS. 8A to 8F, a method of manufacturing a BDEI substrate comprising at least: a first step of forming a plurality of high strained layers of high impurity concentration regions 54 in a surface layer of a first semiconductor substrate 41 at predetermined areas, a second step of directly bonding a second semiconductor substrate 68 on the first semiconductor substrate on the side of the high impurity concentration region 54, a third step of forming a groove 47 in the second semiconductor substrate 68 over each high impurity concentration region 54, the groove extending from the top surface of the second semiconductor substrate 68 to a depth shallower than the groove, and a fourth step of burying a dielectrics 42 in the inside of each groove 47. "The top surface of the second semiconductor substrate 68" is obviously the top principal surface of the second semiconductor substrate, or the top surface not mating with the directly bonded first semiconductor substrate 41.

Other and further objects and features of the present invention will become obvious upon an understanding of the illustrative embodiments about to be described in connection with the accompanying drawings or will be indicated in the appended claims, and various advantages not referred to therein will occur to one skilled in the art upon employing of the invention in practice.

DETAILED DESCRIPTION OF THE EMBODIMENTS

Figure 1:
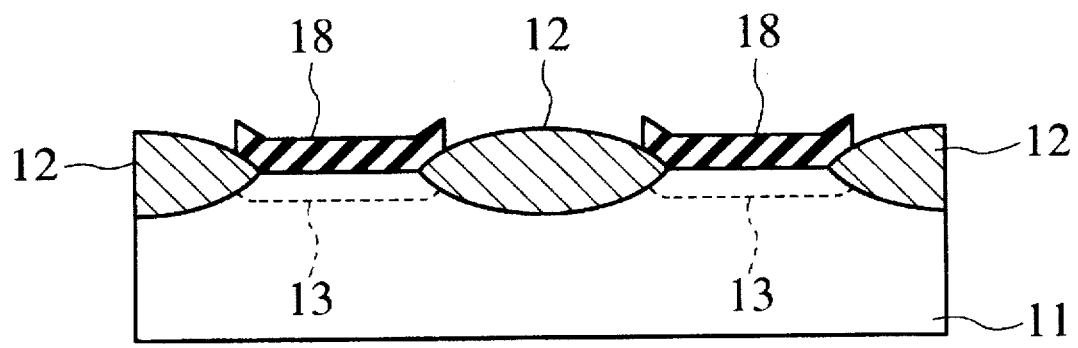
FIG. 1 is a cross sectional view showing an element isolation structure formed by a LOCOS method typical as a conventional technique.
Figure 2:
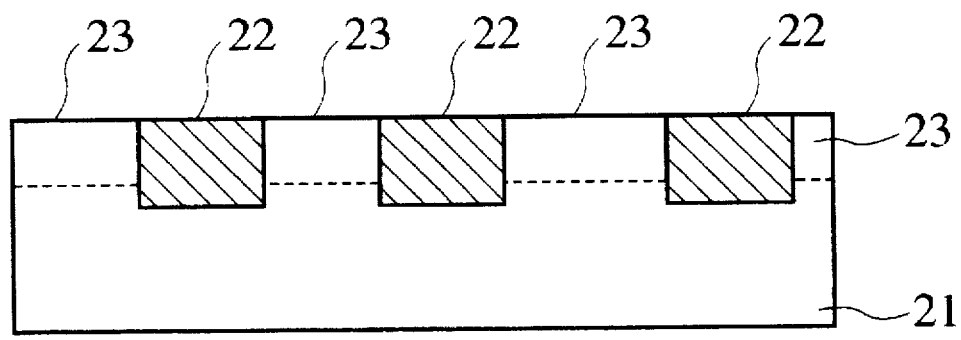
FIG. 2 is a cross sectional view showing the structure of conventional buried oxide (BOX) isolation.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

(1st Embodiment)

Figure 3:
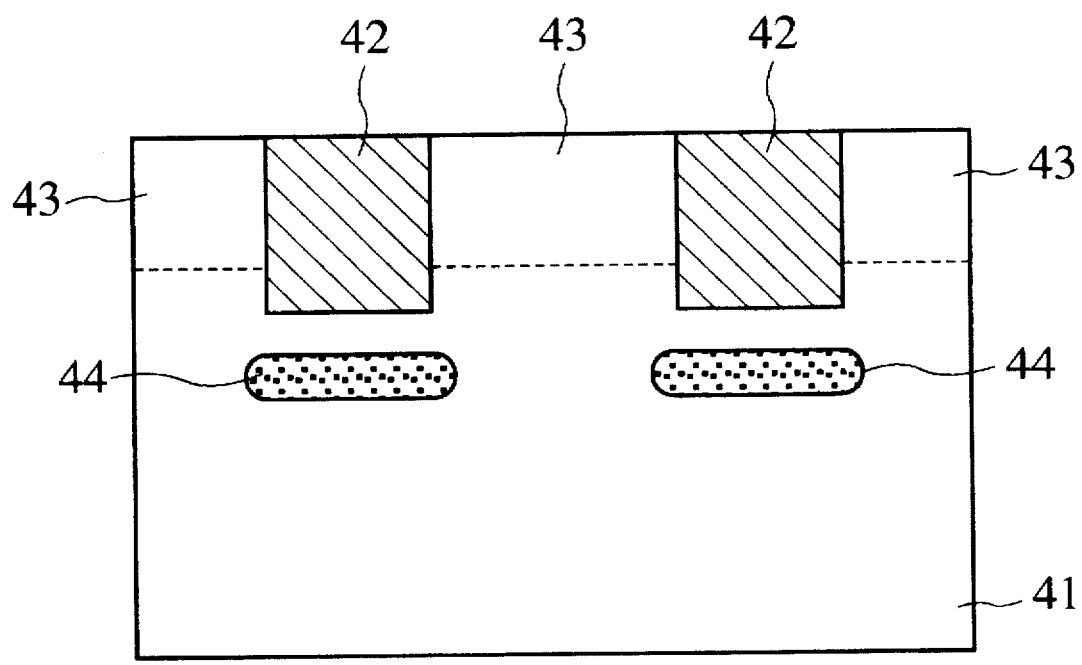
FIG. 3 is a cross sectional view showing the structure of a buried dielectrics element isolation (BDEI) substrate according to a first embodiment of the invention.

FIG. 3 is a schematic cross sectional diagram showing a semiconductor substrate according to the first embodiment of the invention. In FIG. 3, a U-groove is formed in a semiconductor substrate 41 from its surface to a predetermined depth, e.g., 1 μm deep. And a dielectrics 42 such as $SiO_2$ is buried in the U-groove to form an element isolation region 42. The region between two adjacent element isolation regions 42 is an element forming region (a device region or an active region). The dielectrics (insulating member) 42 may obviously be made of a multi-layer structure of an oxide film of 80 to 300 nm thick formed on the inner wall of the U-groove and a polysilicon film formed on the oxide film to bury the U-groove. In a semiconductor region 41 under each element isolation region 42, a high strained layer 44 is formed. If the depth of the groove is 1 μm, the high strained layer 44 is preferably formed at a depth of 1.5 μm or shallower from the substrate surface. The structure shown in FIG. 3 has the high strained layer 44 just under the element isolation region 42. Therefore, crystal defects near the buried dielectrics layer 42 generated by the stress due to a difference of thermal expansion coefficient between the semiconductor layer and buried dielectrics layer, are guided and propagated toward the high strained layer 44 and do not reach the element forming region 43 or the active region. However, if the depth of the high strained layer 44 is 1.5 times or more of that of the groove, the inducement of crystal defects towards the strained layer becomes difficult. It is therefore preferable to set the depth of the high strained layer, e.g., about 1.1 to 1.4 times or more of that of the groove.

Figure 4:
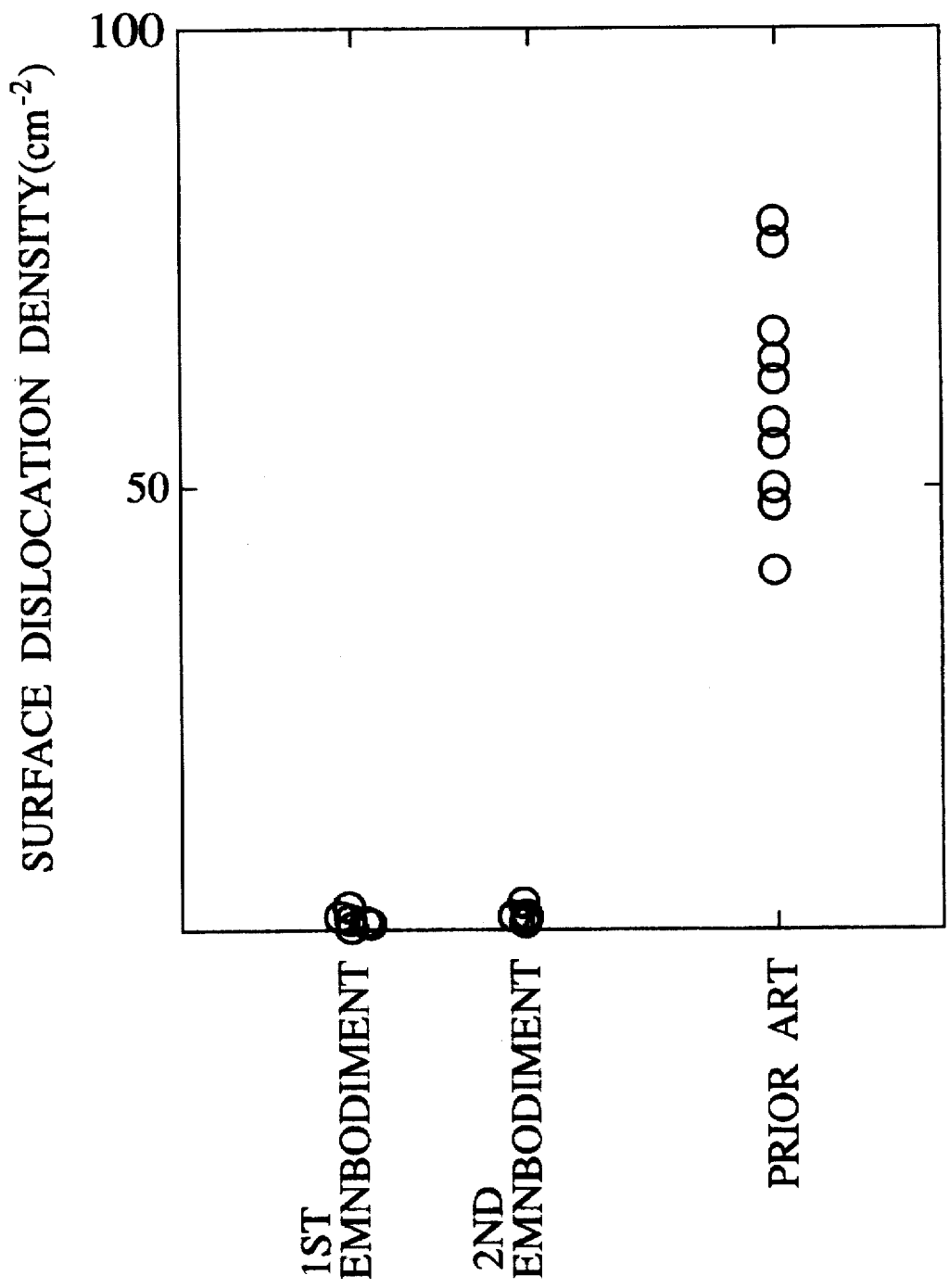
FIG. 4 is a comparison diagram showing dislocation densities in substrates according to the first and second embodiments, and the results for a prior art are also included.

FIG. 4 is a comparison diagram showing dislocation pits density generated in a prior art (BOX) substrate, having the same structure as the invention except that the high strained layer 44 is not formed, and the density in the buried dielectrics element isolation (BDEI) substrate of the first embodiment of the invention (also of the second embodiment to be described later). Dislocation pits were observed by selectively etching the surface of the element forming region after predetermined processes of forming in the element forming region a MOSFET, a MOS capacitor, and a p-n junction devices. As compared to a prior art BOX substrate having high dislocation density of about 50 pits/cm² or more, the substrate of the first embodiment of the invention has a low dislocation density of about several pits/cm² or no pit. However, even in the first embodiment of the invention, dislocations of high density exist locally between the bottom surface of the groove and the high strained layer.

Figure 5:
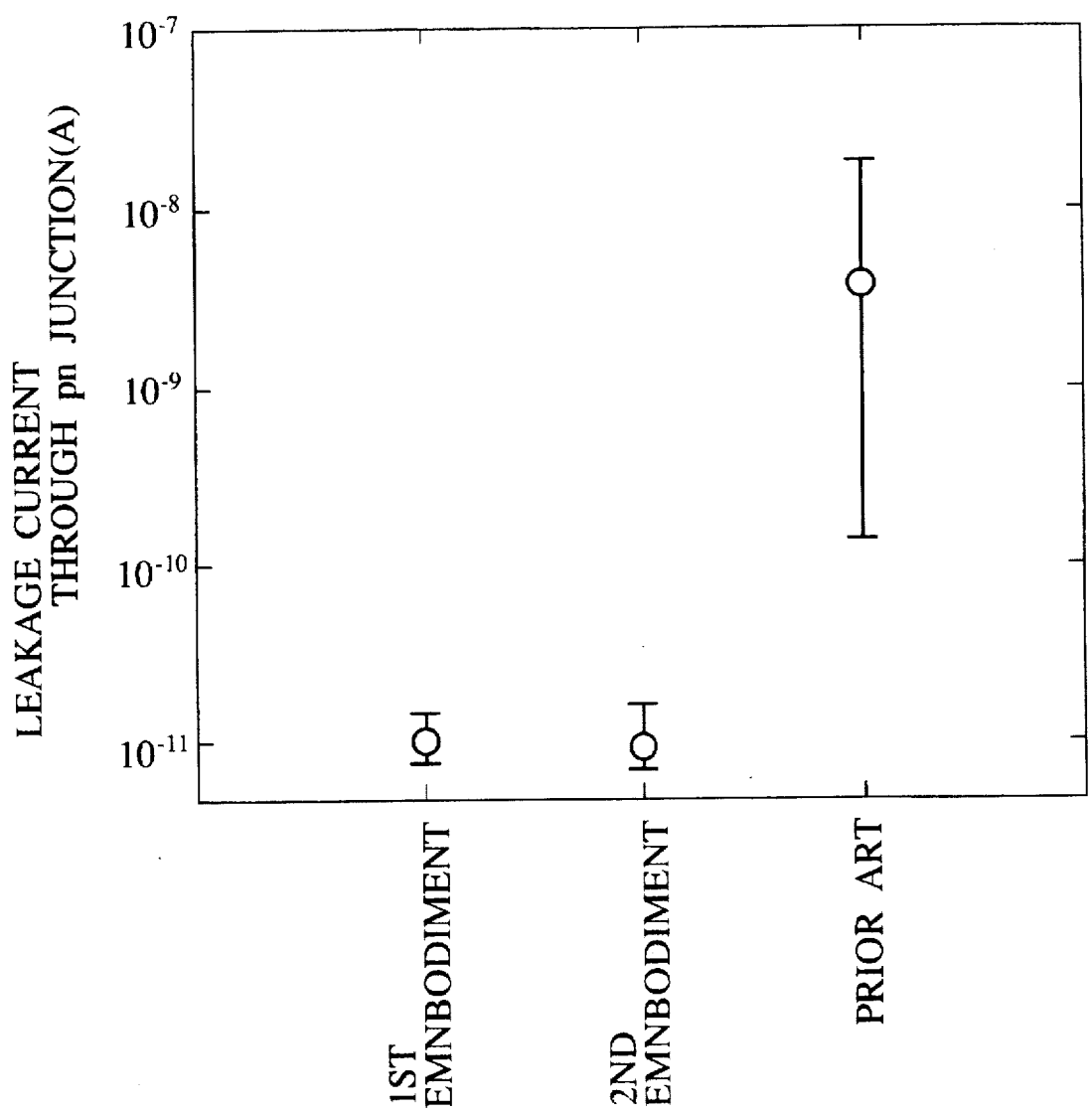
FIG. 5 is a comparison diagram showing p-n junction leakage currents in element forming regions according to the invention and a prior art.

FIG. 5 shows the electrical characteristics of a semiconductor device using a BDEI substrate of the first embodiment of the invention, being compared with the prior art substrate. As seen from FIG. 5, junction leakage current at a p-n junction is in the order of $10^{-11}$ A or smaller which is smaller than the prior art substrate by two digits. Specifically, if the prior art BOX substrate is used, a p-n junction leakage current of about $10^{-8}$ to $10^{-10}$ flows because of dislocations in the p-n junction. However, according to the first embodiment of the invention, since there is no dislocation in the active layer, the p-n junction leakage current reduces to the order of $10^{-11}$ A as seen from FIG. 5. FIG. 5 also shows the p-n junction leakage current flowing in the substrate of the second embodiment of the invention to be described later.

Figure 6A:
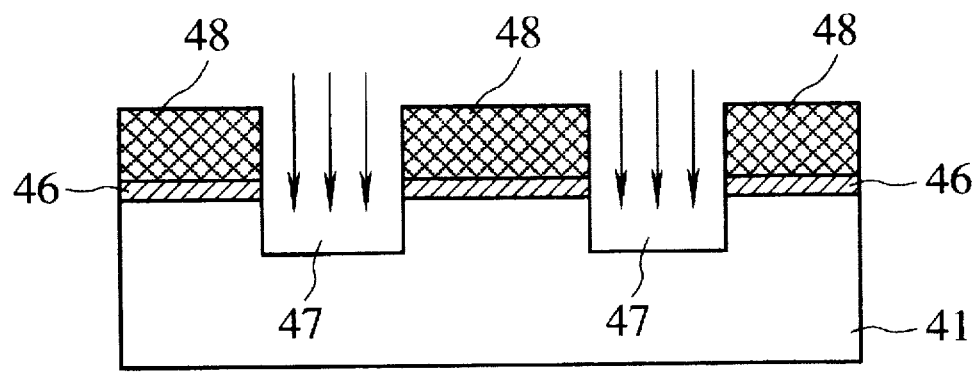
FIGS. 6A to 6C are cross sectional diagrams illustrating the processes for manufacturing a BDEI substrate according to a first embodiment of the invention.
Figure 6B:
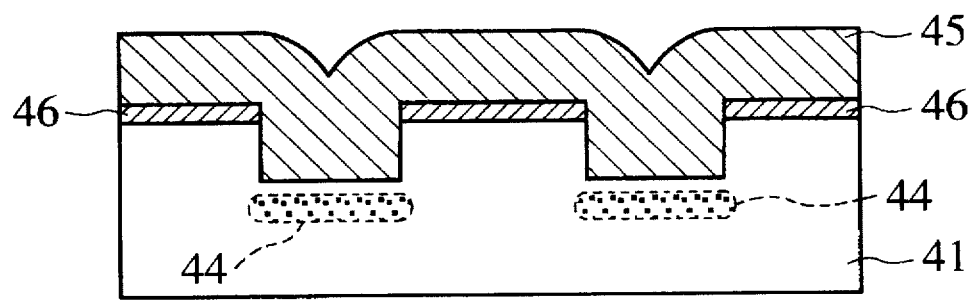
Figure 6C:
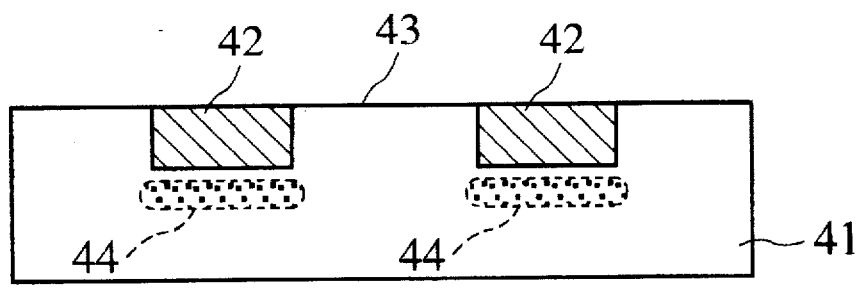

The BDEI substrate of the first embodiment of the invention can be manufactured as illustrated in FIGS. 6A to 6C. In the first embodiment of the invention, a substrate for MOSLSIs will be described. Therefore, a typical substrate with the (100) plane is used. It is obvious that planes different from the (100) plane may be used. In the case of bipolar LSIs and power ICs, the (111) plane may be used, if desired.

(a) First, on the mirror surface of a silicon substrate 41 with the (100) plane, a silicon oxide film 46 is formed to a thickness of 100 nm through steam oxidation. A photoresist film 48 is coated on the surface of the oxide film 46 and patterned into a photoresist pattern 48 by photolithography. By using this photoresist pattern 48 as an etching mask, the oxide film 46 is selectively etched to form rectangular patterns of the oxide film 46, and each rectangular mask pattern 48 having a size of 0.5 µm×1 µm. Namely, a plurality of rectangular mask patterns are disposed on the same plane at a space of 0.5 µm between adjacent patterns, to thereby expose the surface of the silicon substrate 41 at the areas other than the active regions are planned to be formed. Thereafter, by using the composite mask of the oxide film 46 and photoresist pattern 48 as an etching mask, the exposed surface of the silicon substrate 41 is etched by the reactive ion etching (RIE) to form a groove having an essentially vertical side wall of 1 µm deep as shown in FIG. 6A. Further, by using the photoresist pattern 48 as a mask, $^{75}$As$^+$ ions are implanted into the bottom of the groove under the conditions of an acceleration energy Vac of 150 keV and a dose φ of $10^{16}$ to $10^{17}$ cm$^{-2}$. RIE for the silicon substrate 41 may be performed, for example, by adjusting the etching pressure of a mixed gas of CF$_4$ and H$_2$ to 1.3 Pa and applying a high frequency (RF) power of 0.22 W/cm² at 13.56 MHz. Alternatively, RIE may be performed by using a mixed gas of SF$_6$ and O$_2$ or a gas of Cl$_4$, SiCl$_4$ or PCl$_3$. In this manner, U-grooves of 0.5 µm width can be formed around the rectangle pole of 0.5 µm×1 µm.

(b) Next, as shown in FIG. 6B, the photoresist pattern 48 is removed by ashing with ozone (O$_3^+$). After the substrate 41 is washed, an SiO$_2$ film 45 is deposited about 1.1 to 1.5 µm thick by low pressure CVD (LPCVD) or the like. Instead of LPCVD, ECR plasma CVD or ICP-CVD may also be used. CVD using organic silicon such as TEOS (Tetrethylorthosilicate: Si(OC$_2$H$_5$)$_4$) may be used.

(c) Next, as shown in FIG. 6C, the surface of the silicon substrate 41 is planarized by planarizing heat treatment and polishing. With this planarizing process, the structure of the U-groove 47 buried with the dielectrics (SiO$_2$) film 45 is completed and a high strained layer 44 of a high impurity concentration region is formed under the element isolation insulating film 42. In this manner, the BDEI substrate of the first embodiment of the invention is completed. Polishing for planarization illustrated in FIG. 6C may use CMP (Chemical Mechanical Polishing), or reverse sputtering through plasma discharge or the like.

In the method of manufacturing a semiconductor substrate of the first embodiment of the invention, As$^+$ ion is used as the element ion of ion implantation. Other ions such as B$^+$, P$^+$, and Sb$^+$ ions may be used. Ar$^+$ ions electrically inactive may be used, or the same Column element (in the Periodic Table) as Si, such as Ge$^+$ ions, may be implanted. These ions are implanted into the silicon substrate 41 at a high impurity concentration of about $6\times10^{18}$ to $1\times10^{21}$ cm$^{-3}$, or preferably $1\times10^{°}$ to $1\times10^{21}$ cm$^{-3}$ to form the high strained layer.

(2nd Embodiment)

Figure 7A:
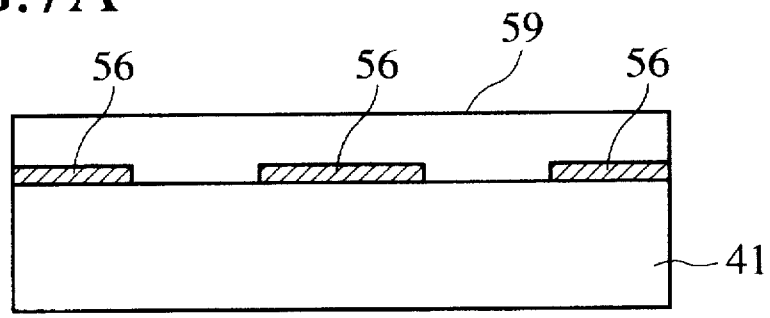
FIGS. 7A to 7D are cross sectional diagrams illustrating the processes for manufacturing a BDEI substrate according to a second embodiment of the invention.
Figure 7B:
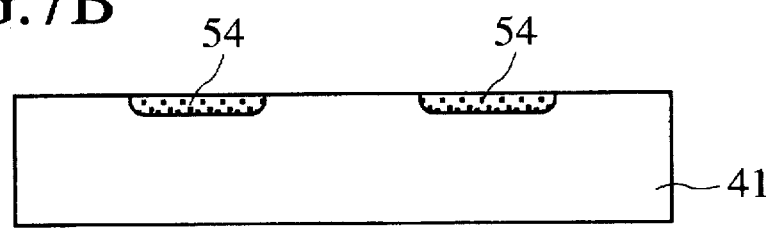
Figure 7C:
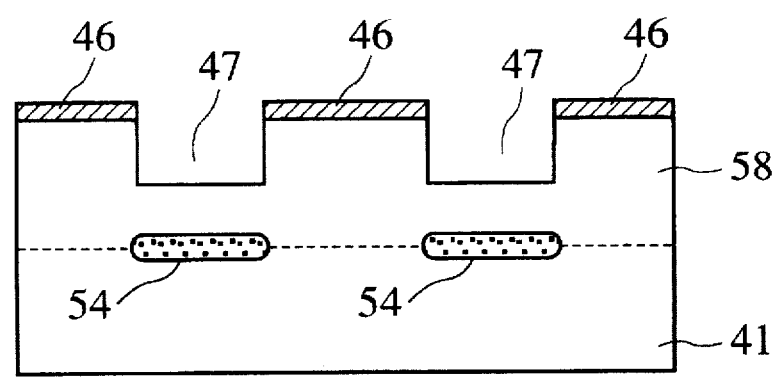
Figure 7D:
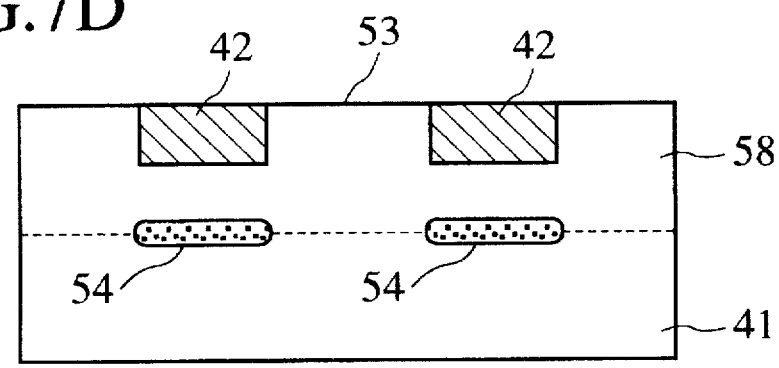

FIGS. 7A to 7D are schematic cross sectional diagrams illustrating a method of manufacturing a BDEI substrate of the second embodiment of the invention. As shown in FIG. 7D, the finished structure is similar to the first embodiment of the invention shown in FIG. 3. The method of manufacturing a semiconductor substrate (BDEI substrate) of the second embodiment of the invention will be described in the following.

(a) On the surface of a silicon substrate 41 having, e.g., the (100) plane, an SiO$_2$ film 56 is formed to a thickness of 100 to 300 nm through steam oxidation, CVD or the like. This SiO$_2$ film 56 is patterned after photolithography to partially expose the surface of the silicon substrate 41. In the case of bipolar LSIs, static induction transistor (SIT) LSIs, and power ICs, it is obvious that other planes such as (111) may be used depending upon the design specification. After the selective etching of the SiO$_2$ film 56, the photoresist mask used for etching the SiO$_2$ film 56 is removed. At this state, as shown in FIG. 7A, the SiO$_2$ film 56 is left on the surface of the silicon substrate 41, the SiO$_2$ film 56 having a plurality of rectangular windows of 0.5×1 µm. The windows may have other shapes such as hexagonal, octagonal, and circular. Next, as shown in FIG. 7A, on the whole surface of the silicon substrate 41 and SiO$_2$ film 56, a coating agent 59 containing impurities such as antimony (Sb) is coated for the impurity diffusion.

(b) Next, the silicon substrate 41 shown in FIG. 7A is subjected to a heat treatment for about 3 hours at 1200° C. to diffuse the impurities into the silicon substrate 41 and form a diffused layer 54 having an impurity concentration of $6\times10^{18}$ to $1\times10^{21}$ cm$^{-3}$. Thereafter, as shown in FIG. 7B, the coating agent 59 and SiO$_2$ film 56 are removed. Since it takes a certain time for a temperature rising and falling to and from 1200° C. the heat treatment of the above impurity diffusion include the condition equivalent to a heat treatment for 5 fours at temperature over 800° C., as a whole.

(c) Next, as shown in FIG. 7C, on the surface of the silicon substrate 41 with selectively formed diffusion layers 54, a silicon epitaxial growth layer 58 is formed to a thickness of 2 µm. This epitaxial growth may use, for example, a cylinder type vapor phase epitaxial (VPE) growth system under the condition of a substrate temperature of 1150° C. using SiH$_2$Cl$_2$ gas as a source gas and H$_2$ gas as a carrier gas. After the epitaxy, on the surface of the silicon epitaxial growth layer 58, a thermally oxidized film 46 is formed to a thickness of 300 nm and selectively etched after photolithography to form a predetermined pattern. The photoresist pattern used as the etching mask of the thermally oxidized film 46 is thereafter removed. By using the thermally oxidized film 46 as a mask, U-grooves 47 shown in FIG. 7C are formed by etching the surface of the silicon epitaxial growth layer 58 through RIE using $CCl_4$ or the like. And the U-grooves having a width of 0.3 μm to 0.5 μm and a depth of 1 μm are dug.

(d) Next, a dielectrics ($SiO_2$) film 42 is deposited to about 1.1 to 1.5 μm thick by low pressure CVD (LPCVD). Instead of LPCVD, ECR plasma CVD or ICP-CVD may be used. Thereafter, as shown in FIG. 7D, planarizing heat treatment and polishing are performed so as to make the surface of a silicon substrate 53 at the element forming region flush with the surface of the element isolation insulating film 42. With this planarizing heat treatment and polishing process, the semiconductor substrate of the second embodiment of the invention is completed in which the element isolation insulating film 42 of $SiO_2$ is buried in the U-groove 47 and high strained layers 54 of high impurity concentration regions are formed under the element isolation insulating films 42. Polishing for planarization illustrated in FIG. 7D may use CMP or the like.

MOS-LSIs, bipolar LSIs, and SIT-LSI can be manufactured by forming, in the element forming regions of the BDEI substrates of the second embodiment of the invention, active elements such as MOSFETs, bipolar transistors, SITs, and MOS capacitors. During such manufacturing processes or during the process of forming a buried dielectrics (insulator), dislocations are generated by strains caused by a difference of thermal expansion coefficient between silicon and silicon oxide. The dislocations are generated mainly at the corners of the bottom of the element isolation groove. According to the second embodiment of the invention, since the high strained layer of a high impurity concentration region exists under the U-groove (buried groove), dislocations generated at the bottom of the buried groove are guided and expanded toward the high strained layer 54. Therefore, dislocations do not propagate toward the element forming region 53, making it a defect-free layer. Once dislocations are generated, the strain is relaxed and the dislocations will not be increased at later thermal processes. FIG. 4 show the observed results of dislocation pits after a MOSFET, a MOS capacitor, and a p-n junction device are formed in the element forming region of a prior art BOX substrate and of a BDEI substrate of the second embodiment of the invention. Dislocation pits were observed by selectively etching the substrate surface. As compared to the prior art BOX substrate having a dislocation pit density of 50 pits/$cm^2$, the second embodiment of the invention has a low density nearly equal to no dislocation pit as seen from FIG. 4. However, even in the second embodiment of the invention, high density dislocation pits are locally generated between the groove bottom and high strain layer.

FIG. 5 shows a comparison with a prior art with respect to p-n junction leakage current. According to the second embodiment of the invention, as compared to the prior art, the leakage current decreases by two digits, to the order of $10^{-11}$ A as seen from FIG. 5. This leakage current reduction may be ascribed to the fact that dislocations in the p-n junction of the prior art is decreased in the second embodiment of the invention because there is no dislocation in the element forming region (active layer) 53.

In the description of the method of manufacturing a semiconductor substrate according to the second embodiment of the invention, solid phase diffusion for forming the diffusion layer 54 is performed by using Sb diffusion coating agent. This diffusion may be performed by another way such as ion implantation technique and annealing of implanted $As^+$, $Sb^+$, $B^+$, $P^+$ ions, or the like for activation and further diffusion of the impurities into deeper positions. The vapor phase diffusion in which after the "predeposition" of P (in $POCl_3$ ambient), B (in $BBr_3$ ambient) or the like on the Si substrate, "the drive-in" annealing for providing a suitable impurity distribution is performed, is also employable.

(3rd Embodiment)

Figure 8A:
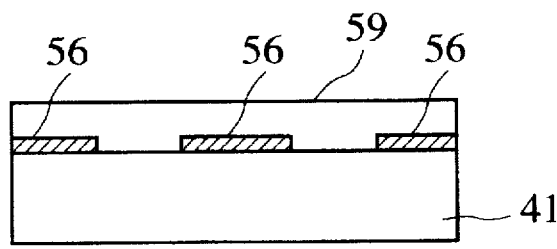
FIGS. 8A to 8F are cross sectional diagrams illustrating the processes for manufacturing a BDEI substrate according to a third embodiment of the invention.
Figure 8B:
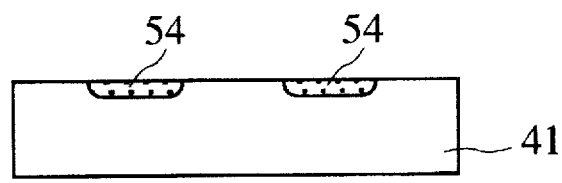
Figure 8C:
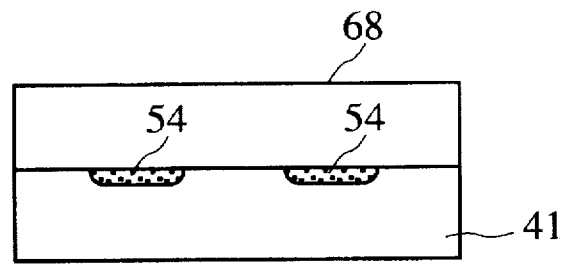
Figure 8D:
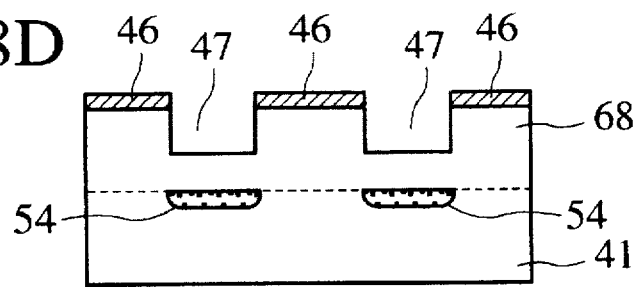
Figure 8E:
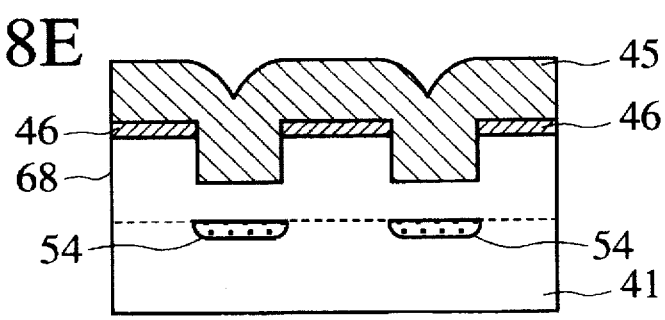
Figure 8F:
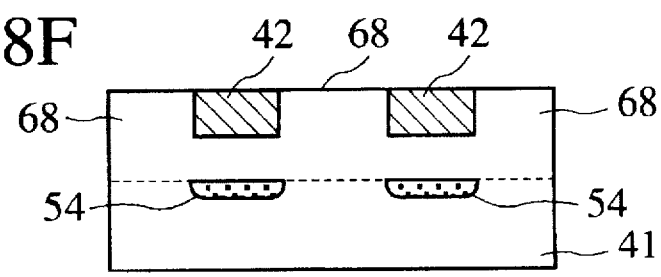

FIGS. 8A to 8F are schematic cross sectional diagrams illustrating a method of manufacturing a semiconductor substrate (BDEI substrate) of the third embodiment of the invention (as shown in FIG. 8F (the finished structure is equivalent to the first embodiment of the invention shown in FIG. 3). The method of manufacturing a BDEI substrate of the third embodiment of the invention will be described in the following.

(a) On the surface of a silicon substrate 41 having a predetermined crystal plane, an $SiO_2$ film 56 is formed to a thickness of 100 to 350 nm through steam oxidation or CVD method. This $SiO_2$ film 56 is patterned after photolithography to partially expose the surface of the silicon substrate 41 to form a diffusion window. Thereafter, the photoresist used as the etching mask for the $SiO_2$ film 56 is removed. At this state, as shown in FIG. 8A, a diffusion mask 56 of the $SiO_2$ film is formed on the surface of the silicon substrate 41. Next, as shown in FIG. 8A, on the whole surface of the silicon substrate 41 and $SiO_2$ film 56, an Sb contained coating agent 59 is coated. Instead of using the Sb contained coating agent 59, impurity ions such as $As^+$, $Sb^+$, $B^+$, and $P^+$ may be implanted to form high impurity concentration regions, or such impurity atoms may be prediposited in a vapor phase on the areas where the $SiO_2$ film 56 is not formed.

(b) Next, the silicon substrate 41 shown in FIG. 8A is subjected to a heat treatment for about 5 to 10 hours at 1200° C. to form in the silicon substrate 41 an $n^+$-type diffused layer 54 having an impurity concentration of $6 \times 10^{18}$ to $1 \times 10^{21}$ $cm^{-3}$. Thereafter, as shown in FIG. 8B, the Sb contained coating agent 59 and $SiO_2$ film 56 are removed. And the top surface of the silicon substrate 41 is polished to show a mirror surface.

(c) Next, a silicon substrate 69 with a polished mirror surface is prepared. The silicon substrate 41 shown in FIG. 8C and the prepared silicon substrate 68 are mated with facing mirror surface to mirror surface and subjected to a heat treatment to form an SDB (Silicon Direct Bonding) substrate. In this case, the heat treatment may be performed while a voltage is applied. Next, the silicon substrate 68 is polished to adjust its thickness until it becomes 2 μm thick.

(d) On the top surface of the silicon substrate formed by SDB, a thermally oxidized film 46 is formed to a thickness of 300 nm and selectively etched with an aid of photolithography to form a predetermined pattern. The photoresist pattern used as the etching mask of the thermally oxidized film 46 is thereafter removed. By using the thermally oxidized film 46 as a mask, a U-groove 47 shown in FIG. 8D is formed by selectively etching having the depth of 1 μm from the top surface of the silicon substrate 68 through RIE using $CCl_4$, $SiCl_4$, $SF_6$, or the like. Although the plan pattern is not shown, the U-groove 47 is formed as a trench having a width of 0.3 μm and surrounding the rectangular silicon pole of 0.5 μm×1.0 m.

(e) Next, as shown in FIG. 8E, a dielectrics ($SiO_2$) film 45 is deposited to about 1.1 to 1.5 μm thick by low pressure CVD (LPCVD) or the like. Instead of LPCVD, ECR plasma CVD or ICP-CVD may be used.

(f) Lastly, as shown in FIG. 8F, planarizing is performed so as to make the surface of the silicon substrate 68 flush with the surface of the element isolation insulating film 42 of dielectrics (SiO$_2$). With this planarizing process, the semiconductor substrate of the third embodiment of the invention is completed in which the element isolation insulating film 42 of SiO$_2$ is buried in the U-groove 47 and high strained layers 54 of high impurity concentration regions are formed under the element isolation insulating films 42.

LSIs manufactured by forming, in the element forming regions 68 of the BDEI substrates of the third embodiment of the invention, active elements such as MOSFETs, bipolar transistors, SITs, and MOS capacitors, suffer from no dislocation in the element forming regions, so that the p-n junction leakage current can be reduced. The reason for this is that even if dislocations are generated by strains and stress caused by a difference of thermal expansion coefficient between silicon and silicon oxide, mainly at the corners of the bottom of the element isolation groove, these dislocations will not adversely affect the element forming regions. According to the third embodiment of the invention, since the high strained layer 54 exists under the buried groove, dislocations generated at the bottom of the buried groove are moved and expanded toward the high strained layer 54. Therefore, dislocations do not propagate toward the element forming region, making it a defect-free layer. Once dislocations are generated, the strain is relaxed and the dislocations will not be increased at later thermal treatment.

As described so far, according to the present invention, as the BDEI method likely to generate crystal defects, these crystal detects are guided toward the region other than the element forming region and can be controlled to be locally generated, so that the crystal detect density in the element forming region can be lowered. Accordingly the invention can solve the conventional problems of a p-n junction leakage current and a low breakdown voltage of the gate insulating film to be caused by the generation of crystal defects. It is therefore possible to manufacture a buried dielectrics element isolation substrate of high performance and high reliability with ease and with high manufacture yield.

Various modifications will become possible for those skilled in the art after receiving the teachings of the present disclosure without departing from the scope thereof. In the above description, although a MOSLSI is used by way of example, the invention is obviously applicable to a bipolar LSI, an SIT LSI, and to a power IC.

What is claimed is:

1. A substrate having buried dielectrics for element isolation, the substrate comprising:

a) a semiconductor substrate;

b) a plurality of grooves configured to serve as an element isolation region formed in a surface layer of said semiconductor substrate, each of said grooves having an inside and a bottom;

c) a dielectric buried in the inside of each said groove, the dielectric having a different thermal expansion coefficient from that of the semiconductor substrate; and d) a high strained layer consisting of a high impurity concentration region formed locally, just under, and remote from the bottom of each said grooves so as to sandwich a semiconductor region having a lower impurity concentration than the high strained layer between the bottom of each of said grooves and the high strained layer, wherein a stress due to a difference of thermal expansion coefficient between the semiconductor substrate and the dielectric is guided toward the high strained layer.

2. The substrate of claim 1, wherein the impurity concentration of said high impurity concentration region is $1\times10^{20}$ to $1\times10^{21}$ cm$^{-3}$.

3. The substrate of claim 1, wherein said groove has a essentially vertical side wall.

4. The substrate of claim 1, wherein said groove surrounds said element forming region.

5. The substrate of claim 1, wherein said dielectric is silicon oxide.

6. The substrate of claim 1, wherein said high strained layer is remote from the bottom of said groove by a distance of 50% or shallower of a depth of said groove.

7. The substrate of claim 6, wherein a depth of said high strained layer is positioned at about 1.1 to 1.4 times that of the groove from a top of the surface layer of the semiconductor substrate.

8. The substrate of claim 1, wherein said semiconductor substrate is silicon (Si), and said high impurity concentration region comprising a Periodic Table Column IV element and at least one of boron (B), phosphorus (P), arsenic (As) and antimony (Sb).

9. The substrate of claim 1, wherein said semiconductor substrate is silicon (Si), and said high impurity concentration region comprises argon (Ar) and at least one of boron (B), phosphorus (P), arsenic (As) and antimony (Sb).

10. A substrate having buried dielectrics for element isolation, the substrate comprising:

a) a semiconductor substrate;

b) a plurality of grooves configured to act as an element isolation region formed in a surface layer of said semiconductor substrate, each of said grooves having a bottom and an inside partially defined by an inner wall;

c) a dielectric buried in the inside of each said grooves, the dielectric consisting of oxide film formed on the inner wall of respective of the grooves and having a different thermal expansion coefficient from the semiconductor substrate and a polysilicon film formed on the oxide film so as to bury respective of the grooves, and d) a high strained layer consisting of a high impurity concentration region formed locally, just under, and remote from the bottom of each of said grooves so as to sandwich a semiconductor region having a lower impurity concentration than the high strained layer between the bottom of each of the grooves and the high strained layer, wherein, a stress due to a difference of thermal expansion coefficient between the semiconductor substrate and the dielectric is guided toward the high strained layer.

11. The substrate of claim 10, wherein a depth of said high strained layer is positioned at about 1.1 to 1.4 times that of the groove from a top of the surface layer of the semiconductor substrate.

12. The substrate of claim 10, wherein said semiconductor substrate is silicon (Si), and said high impurity concentration region comprises a Periodic Table Column IV element and at least one of boron (B), phosphorus (P), arsenic (As) and antimony (Sb).

13. The substrate of claim 10, wherein said semiconductor substrate is silicon (Si), and said high impurity concentration region comprises argon (Ar) and at least one of boron (B), phosphorus (P), arsenic (As) and antimony (Sb).

* * * * *